(12) United States Patent
Koike et al.

(10) Patent No.: US 10,892,189 B2
(45) Date of Patent: Jan. 12, 2021

(54) METHOD FOR MANUFACTURING A SEMICONDUCTOR DEVICE HAVING A DUMMY SECTION

(71) Applicant: LAPIS Semiconductor Co., Ltd., Yokohama (JP)

(72) Inventors: Osamu Koike, Yokohama (JP); Yutaka Kadogawa, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/460,969

(22) Filed: Jul. 2, 2019

(65) Prior Publication Data

US 2019/0326173 A1    Oct. 24, 2019

Related U.S. Application Data

(62) Division of application No. 15/879,006, filed on Jan. 24, 2018, now abandoned, which is a division of (Continued)

(30) Foreign Application Priority Data

Jul. 10, 2008  (JP) ................................. 2008-180289

(51) Int. Cl.
*H01L 21/768*    (2006.01)
*H01L 23/48*     (2006.01)
(Continued)

(52) U.S. Cl.
CPC .. *H01L 21/76898* (2013.01); *H01L 21/76224* (2013.01); *H01L 21/76819* (2013.01);
(Continued)

(58) Field of Classification Search
CPC ......... H01L 21/76229; H01L 21/31053; H01L 21/76819; H01L 21/76224; H01L 21/3212; H01L 21/31055
(Continued)

(56) References Cited

U.S. PATENT DOCUMENTS 5,402,769 A   4/1995  Tsuji
6,281,049 B1  8/2001  Lee
(Continued)

FOREIGN PATENT DOCUMENTS

JP    H05299611 A    11/1993
JP    2004228320 A    8/2004
(Continued)

*Primary Examiner* — David Chen
(74) *Attorney, Agent, or Firm* — Rabin & Berdo, P.C.

(57) ABSTRACT

There is provided a semiconductor device comprising a semiconductor substrate having an active area in which a plurality of active elements are formed, and a non-active area excepting the active area; at least one electrode pad electrically connected to any of the active elements. At least one Through Silicon VIA electrode is formed, being electrically connected to the electrode pad by way of the non-active area. The non-active area has an insulating region obtained by forming an insulating film on the semiconductor substrate, and a dummy section obtained by leaving a base material of the semiconductor substrate in the insulating region. The dummy section is provided in a position where an outer edge of the Through Silicon VIA electrode does not intersect with the boundary between the insulating region and the dummy section.

2 Claims, 10 Drawing Sheets

Related U.S. Application Data application No. 12/458,324, filed on Jul. 8, 2009, now Pat. No. 9,892,968.

(51) Int. Cl.
  *H01L 21/762* (2006.01)
  *H01L 27/146* (2006.01)
  *H01L 21/3105* (2006.01)
  *H01L 21/321* (2006.01)

(52) U.S. Cl.
  CPC ...... *H01L 23/481* (2013.01); *H01L 21/31053* (2013.01); *H01L 21/3212* (2013.01); *H01L 21/76229* (2013.01); *H01L 27/14636* (2013.01); *H01L 2224/02372* (2013.01); *H01L 2224/0401* (2013.01); *H01L 2224/05* (2013.01); *H01L 2224/05548* (2013.01); *H01L 2224/13021* (2013.01); *H01L 2224/13024* (2013.01); *H01L 2225/06541* (2013.01)

(58) Field of Classification Search
  USPC ........ 438/296, 424, 427, 437, 692; 257/774, 257/E21.244, E21.304, E21.548
  See application file for complete search history.

(56) References Cited

U.S. PATENT DOCUMENTS

| | | |
|---|---|---|
| 6,833,622 B1 | 12/2004 | Zagrebelny et al. |
| 7,851,880 B2 | 12/2010 | Suzuki et al. |
| 2002/0074611 A1 | 6/2002 | Koubuchi et al. |
| 2004/0262767 A1 | 12/2004 | Matsuo |
| 2005/0221601 A1 | 10/2005 | Kawano |
| 2006/0048572 A1 | 3/2006 | Isogai et al. |
| 2006/0087042 A1 | 4/2006 | Kameyama et al. |
| 2008/0135877 A1 | 6/2008 | Inoue et al. |
| 2008/0290524 A1 | 11/2008 | Lanzerotti et al. |
| 2009/0191708 A1 | 7/2009 | Kropewnicki et al. |

FOREIGN PATENT DOCUMENTS

| | | |
|---|---|---|
| JP | 2005235858 A | 9/2005 |
| JP | 2006128171 A | 5/2006 |
| JP | 2007242693 A | 9/2007 |
| JP | 2008053287 A | 3/2008 |
| JP | 2008135553 A | 6/2008 |
| JP | 2009158862 A | 7/2009 |
| JP | 2009158863 A | 7/2009 |

METHOD FOR MANUFACTURING A SEMICONDUCTOR DEVICE HAVING A DUMMY SECTION

CROSS-REFERENCE TO RELATED APPLICATION

This application is a division of U.S. application Ser. No. 15/879,006, filed on Jan. 24, 2018, which was a division of U.S. application Ser. No. 12/458,324, filed on Jul. 8, 2009 (issued on Feb. 13, 2018, as U.S. Pat. No. 9,892,968). Furthermore, these applications claim the benefit of priority of Japanese Patent Application No. 2008-180289, filed on Jul. 10, 2008. The entire disclosures of these prior U.S. and Japanese applications are incorporated herein by reference.

BACKGROUND OF THE INVENTION

1. Field of the Invention

The present invention relates to a method for manufacturing a semiconductor device and a semiconductor package, and particularly relates to a semiconductor device having a Through Silicon VIA electrode structure.

2. Description of the Related Art

Recent versions of information devices such as digital cameras and mobile phones equipped with a camera function embody considerably higher levels of miniaturization, density, and functionality. A wafer-level chip size package (hereinafter referred to as W-CSP) is a known technique for reducing the size of CCD sensors, CMOS sensors, and other imaging elements used in such devices to fit in a chip-scale package.

The W-CSP is a new concept package in which all the assembly steps are completed in a wafer state.

A Through Silicon VIA electrode structure is adopted in the image sensor of a W-CSP structure because reliability can be improved and the device can be made smaller. An electrode that allows the semiconductor device to have signal interchange with the exterior is ordinarily formed on the same surface as the formation surface of the semiconductor elements. In contrast, with Through Silicon VIA electrodes, Through Silicon VIA holes are formed in the thickness direction of the chip from the reverse side of the chip using microfabrication, conductive wiring is formed inside the Through Silicon VIA holes, and the conductive wiring is connected to surface electrodes, whereby signal interchange is made possible from the reverse surface of the chip which is not ordinarily used. Stacking a plurality of chips using a Through Silicon VIA electrode technique and forming signal transmission pathways in the thickness direction of the chip makes it possible to make wiring distances shorter than with conventional wiring. Therefore, packaging density can be dramatically improved and speed and reliability can be increased. Methods for manufacturing CSP having a Through Silicon VIA electrode are described in, e.g., Japanese Laid-open Patent Application Nos. 2006-128171 and 2005-235858.

A CMOS sensor, for example, is an imaging element for reading an electric charge accumulated in a photodiode that has been converted to voltage and amplified in each pixel, and is provided with a photodiode, a cell amplifier, and the like inside a unit cell. A CMOS sensor is composed of a plurality of active elements that constitute a photodiode and a cell amplifier on a semiconductor substrate, and STI (shallow trench isolation) is used for discrete insulation between each active element. The region for forming transistors, diodes, and other active elements on the semiconductor substrate is referred to as an active area, while a region other than the active area is referred to as a non-active area. In other words, STI and other element isolation regions belong to the non-active area. Flattening by CMP (chemical mechanical polishing) is carried out in the step for forming an STI on the semiconductor substrate, and dishing occurs. In dishing, the center portion of the STI is formed into a concave dish-shape by the difference in polishing rates between the oxide film constituting the STI and the nitride film provided as a stopper during polishing when the surface area of the STI region is increased. Difficulties arise in later steps because the flatness of the substrate is detracted when dishing occurs. A technique for preventing dishing involves the formation of a dummy pattern having a plurality of island-shaped dummy sections inside the non-active area, which is the location when dishing occurs. The dummy pattern is formed by leaving the base material of the silicon substrate in island shapes inside the STI region, and is therefore referred to as a dummy active. Dishing can be prevented because the difference between the polishing rates in the CMP step is lessened by the uniform formation of a dummy active in the non-active area (STI region).

In an image sensor having a W-CSP structure, a Through Silicon VIA electrode is generally formed in the non-active area in which active elements are not formed, and a plurality of dummy actives is formed in order to prevent dishing in the non-active area as described above. In other words, a dry etching step for forming Through Silicon VIA holes in the non-active area in which the plurality of dummy actives is formed is included in the steps for manufacturing an image sensor. However, there is a problem in that notches (outwardly expanding depressions in the side wall of the Through Silicon VIA hole) are generated in the sidewall of the Through Silicon VIA holes when Through Silicon VIA holes are formed so as to pass through the non-active area in which the plurality of dummy actives are uniformly disposed.

Figure 1A:
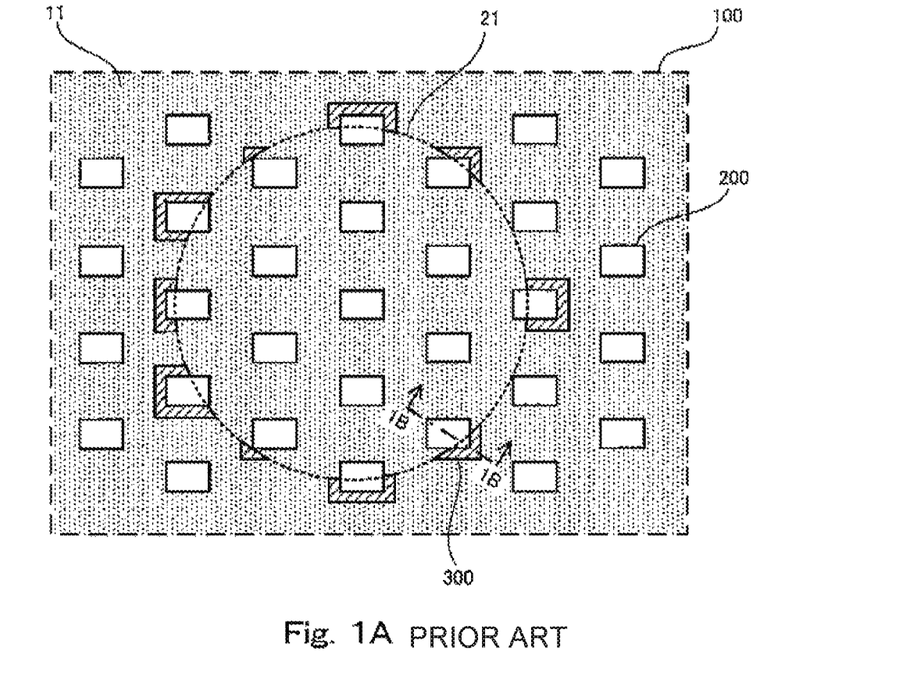
FIG. 1A is a plan view showing the configuration of a conventional dummy pattern formed in a non-active area.

FIG. 1A is a plan view showing the surface structure of a semiconductor substrate in the Through Silicon VIA electrode formation area in a conventional image sensor. The Through Silicon VIA hole 21 has a substantially cylindrical shape and is formed in the non-active area 100 in which photodiodes, transistors and other active elements are not formed. The non-active area 100 comprises an STI region mainly composed of $SiO_2$. A plurality of island-shaped dummy actives 200 for preventing dishing is uniformed disposed in the non-active area (STI region). The Through Silicon VIA hole 21 is formed so as to pass through the non-active area in which the plurality of dummy actives 200 is arrayed. At this point, dummy actives 200 are present in positions in which the outer edge of the Through Silicon VIA hole 21 passes because the array pitch and the dimensions of the dummy actives 200 are relatively small in comparison with the size of the Through Silicon VIA hole 21.

Figure 1B:
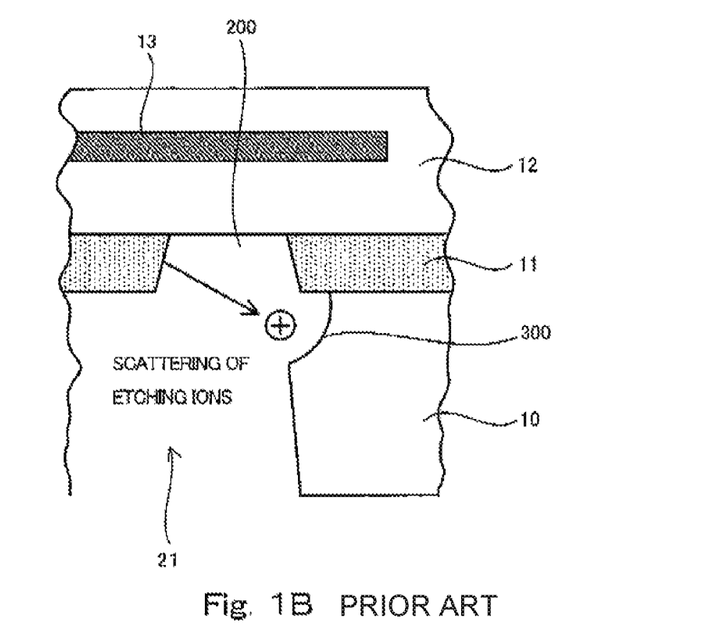
FIG. 1B is a cross-sectional view along the line 1B-1B in FIG. 1A.

FIG. 1B is a cross-sectional view along the line 1B-1B in FIG. 1A. An interlayer insulating film 12 is formed on the semiconductor substrate 10. The electrode pad 13 electrically connected to the sensor section is formed in the interlayer insulating film 12. The Through Silicon VIA electrode is formed by forming a Through Silicon VIA hole 21 from the reverse surface of the semiconductor substrate toward the electrode pad 13 by dry etching. Notches 300 are generated in the dry etching process when dummy actives 200 are present in positions through which the outer edge of the Through Silicon VIA hole passes, i.e., when the outer edge of the Through Silicon VIA hole intersects with the dummy actives 200. The notches 300 are depressions formed in the sidewall of the Through Silicon VIA hole 21 in positions at the depth near the boundary between the interlayer insulating film 12 and the semiconductor substrate 10. In FIG. 1A, the locations where notches are generated are indicated by shading. It is apparent from the drawing that the notches 300 are generated only in locations where the outer edge of the Through Silicon VIA hole 21 intersects with the dummy actives 200.

In the step for forming a Through Silicon VIA electrode, a Through Silicon VIA hole 21 is formed, after which a process is carried out to sequentially form plating composed of a barrier metal, a plating seed layer, and electroconductive wiring of the Through Silicon VIA electrode on the inner wall of the Through Silicon VIA hole. Cu is generally used as the plating. However, because Cu is a typical material that constitutes metal contamination in the silicon device and diffuses into the silicon substrate and the interlayer insulating film at lower temperatures, there is a risk of a deterioration of the device performance and reliability, for example, junction leaks and dielectric breakdowns in the interlayer insulating film. For this reason, a barrier metal composed of Ti, Ti/Ni, or the like is formed between the semiconductor substrate and the Cu film that constitutes the electroconductive wiring of the Through Silicon VIA electrode in order to prevent Cu-diffusion into the silicon substrate.

However, it is difficult to form a sufficient barrier metal in the area where notches are generated in the case that notches occur in the sidewall of the Through Silicon VIA hole, and insufficient coverage by the barrier metal is liable to occur in notched area. In this case, Cu could diffuse into the semiconductor substrate in the areas where there is insufficient coverage by the barrier metal, and the device performance and reliability are seriously affected.

SUMMARY OF THE INVENTION

The present invention has been contrived in view of the above-described issues, and an object is to provide a semiconductor device having a non-active area in which a dummy pattern is formed on the semiconductor substrate and a Through Silicon VIA electrode is formed so as to pass through the non-active area, wherein the quality, reliability, and stability of the semiconductor device is improved by preventing the occurrence of notches that are generated in a side wall of the Through Silicon VIA electrode.

The semiconductor device of the present invention is a semiconductor device that comprises a semiconductor substrate having an active area in which a plurality of active elements are formed, and a non-active area excepting the active area; at least one electrode pad electrically connected to any of the active elements; and at least one Through Silicon VIA electrode electrically connected to the electrode pad by way of the non-active area, wherein the non-active area has an insulating region obtained by forming an insulating film on the semiconductor substrate, and a dummy section obtained by leaving a base material of the semiconductor substrate in the insulating region, and an outer edge of the Through Silicon VIA electrode does not intersect with the boundary between the insulating region and the dummy section.

The method for manufacturing a semiconductor device of the present invention is method for manufacturing a semiconductor device that comprises a step for forming, on a semiconductor substrate, an active area in which a plurality of active elements are formed, and a non-active area excepting the active area; a step for forming at least one electrode pad electrically connected to any of the active elements; and a step for forming at least one Through Silicon VIA electrode electrically connected to the electrode pad by way of the non-active area, wherein the step for forming the non-active area includes a step for forming a dummy section obtained by leaving a base material of the semiconductor substrate in an insulating region composed of an insulating film; and the Through Silicon VIA electrode is formed such that an outer edge of thereof does not intersect with the boundary between the insulating region and the dummy section.

The method for manufacturing a semiconductor package of the present invention is a method for manufacturing a semiconductor package that includes the semiconductor device described above, comprising a step for forming a Through Silicon VIA hole from the reverse surface of the semiconductor substrate to the electrode pad in a Through Silicon VIA electrode formation area of said semiconductor substrate; a step for forming an insulating film on an inner wall of the Through Silicon VIA hole and the reverse surface of the semiconductor substrate; a step for selectively removing the insulating film of the bottom surface of the Through Silicon VIA hole and exposing the electrode pad inside the Through Silicon VIA hole; a step for sequentially forming a barrier metal and an electroconductive film for covering the reverse surface of the semiconductor substrate and the inner wall of the Through Silicon VIA hole to form the Through Silicon VIA electrode and reverse surface wiring electrically connected to said Through Silicon VIA electrode on the reverse surface of the semiconductor substrate; a step for forming an insulating film having an aperture on the reverse surface of the semiconductor substrate; and a step for forming an external terminal on the exposed portion of the reverse surface wiring through the aperture.

In accordance with the semiconductor device and the method for manufacturing a semiconductor device of the present invention, dishing of the STI region can be prevented by a dummy pattern formed in the non-active area. The Through Silicon VIA electrode formation area of the non-active area has a dummy pattern formed so that no area is generated wherein the outer edge of the Through Silicon VIA electrode intersects the dummy section. Therefore, etching ions are not scattered in the vicinity of the sidewall of the Through Silicon VIA hole and the occurrence of notches in the sidewall of the Through Silicon VIA hole can be prevented. Accordingly, a barrier metal can be formed on the sidewall of the Through Silicon VIA hole without the occurrence of insufficient coverage, and the diffusion of Cu constituting the plating as well as other impurities into the semiconductor substrate can be reliably prevented.

DETAILED DESCRIPTION OF THE INVENTION

The supposed mechanism by which notches are generated in the side wall of a Through Silicon VIA hole when a Through Silicon VIA electrode is formed through a non-active area in which a plurality of dummy actives are uniformly disposed will be described with reference to FIGS. 1A and 1B before a description regarding embodiments of the present invention is given.

Notches in the sidewall of a Through Silicon VIA hole are known to be generated in the dry etching step of a semiconductor substrate when a Through Silicon VIA hole is formed. In the dry etching step, an STI region 11 composed of $SiO_2$ is not etched by selective etching in the step for etching silicon as the base material of a semiconductor substrate 10. For this reason, the inventor posits that etching ions emitted by an etching device are reflected in the STI region 11, are scattered in the lateral direction, and collide with the sidewall of the Through Silicon VIA hole 21, whereby the sidewall of the Through Silicon VIA hole is etched and notches 300 are generated. In other words, it is thought that when a boundary between the SIT region and the dummy actives 200 is present in the vicinity of the sidewall of the Through Silicon VIA hole 21, etching ions scattered at the boundary collide in a high-energy state with the sidewall of the Through Silicon VIA hole and form notches.

Embodiments of the present invention described below are improvements on the configuration of a dummy pattern of a non-active area in the Through Silicon VIA electrode formation area, in that a dummy pattern is provided in such a way as to avoid the formation of an area in which the outer edge of the Through Silicon VIA hole intersects the boundary between the dummy section and the STI region. Therefore, a boundary between the dummy section and the STI region, which causes the etching ions to be scattered, is not formed in the vicinity of the sidewall of the Through Silicon VIA hole. Embodiments of the present invention are described below with reference to the drawings.

Figure 2:
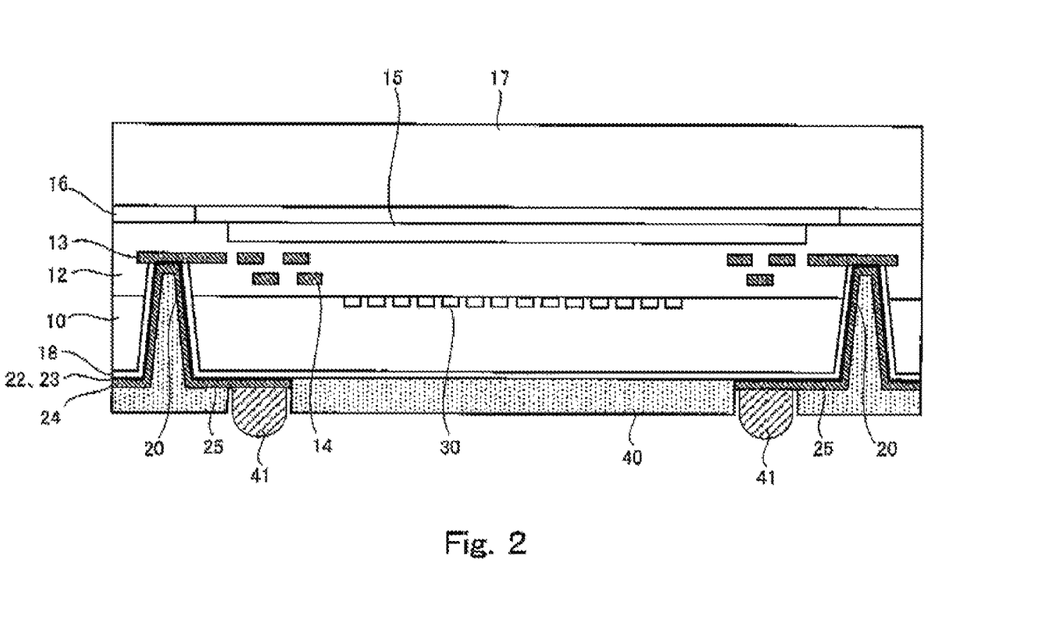
FIG. 2 is a cross-sectional view of an image sensor according to an embodiment of the present invention.

FIG. 2 is a cross-sectional view of an image sensor according to an embodiment of the present invention. A semiconductor substrate 10 composed of a single-crystal silicon or the like constitutes the main body of the image sensor, and formed on the substrate are transistors and other active elements 30 constituting a photodiode and peripheral circuits for processing signals that have undergone photoelectric exchange in the photodiode. Light receiving elements are formed on the semiconductor substrate 10 in a number commensurate with the number of pixels, and the light emitted from an imaging target is formed as an image on the surface of the light receiving elements by externally provided lenses or another optical system. Each of the light receiving elements outputs a photoelectric conversion signal that corresponds to the intensity of the received light, as a detected output signal. Image data is generated from the position of each light receiving element and the detected output signals.

An interlayer insulating film 12 composed of $SiO_2$ or the like is formed on the surface of the semiconductor substrate 10. Electroconductive wiring 14 having a multilayer structure electrically connected to the active elements 30 is formed inside the interlayer insulating film 12. An electrode pad 13 that is electrically connected to the electroconductive wiring 14 is provided in the region further outside the region in which the active elements 30 constituting the sensor section are formed. A color filter 15 for separating the received light into three primary colors is provided on the surface of the interlayer insulating film 12. A cover glass 17 is mounted on the interlayer insulating film 12 via an adhesive sheet 16.

A Through Silicon VIA electrode 20 is provided in the semiconductor substrate 10, from the reverse surface of the semiconductor substrate to the electrode pad 13 inside the interlayer insulating film 12. The Through Silicon VIA electrode 20 is formed by sequentially forming on the bottom surface and sidewall of the Through Silicon VIA hole a barrier metal 22 composed of Ti, Ti/Ni, or the like, a plating seed film 23 composed of Cu or the like and, and a plating film 24 composed of Cu or the like. These electroconductive films constituting the Through Silicon VIA electrode 20 are connected to the electrode pad 13 on the bottom surface of the Through Silicon VIA hole, and are connected to the reverse surface wiring 25 that extends to the reverse surface of the semiconductor substrate 10. The insulation between electroconductive film of the Through Silicon VIA electrode 20 or reverse surface wiring 25 and the semiconductor substrate 10 is ensured by the insulating film 18 composed of $SiO_2$ or the like formed along the sidewall of the Through Silicon VIA hole and the reverse surface of the semiconductor substrate 10. A solder resist 40 is formed on the reverse surface of the semiconductor substrate 10 so as to embed the Through Silicon VIA hole of the Through Silicon VIA electrode 20. An aperture is formed in the solder resist 40. A revere surface electrode pad that constitutes a portion of the reverse surface wiring 25 is provided in the exposed portion through the aperture. A solder bump 41 is provided on the reverse surface electrode pad, thereby constituting an external connection terminal electrically connected to the electrode pad 13 via the Through Silicon VIA electrode 20 and the reverse surface wiring 25. In this manner, the package of the image sensor of the present embodiment has a W-CSP configuration, which is the same size as the semiconductor substrate 10.

Figure 3:
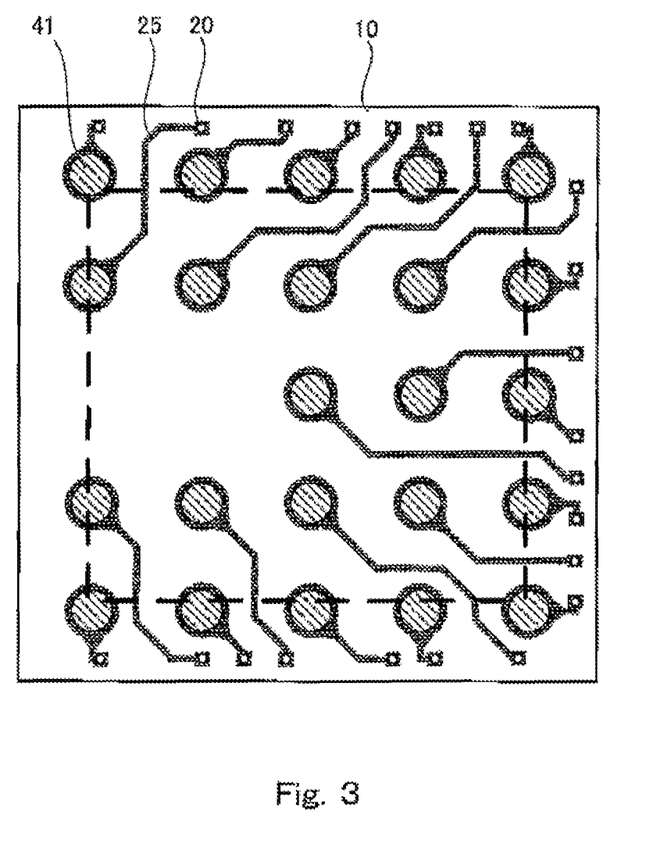
FIG. 3 is a plan view showing the configuration of the reverse surface of the image sensor according to an embodiment of the present invention.

FIG. 3 is a plan view of the image sensor of the present embodiment as seen from the reverse surface side of the semiconductor substrate 10. In the drawing, a plurality of Through Silicon VIA electrodes 20 is formed along the outer edge of the semiconductor substrate 10. The solder bumps 41 are arranged in the form of a grid on the reverse surface of the semiconductor substrate 10 and are electrically connected to the corresponding Through Silicon VIA electrodes 20 via the reverse surface wiring 25. The region enclosed by the broken line in the drawing is a region for forming a sensor circuit in which photodiodes, transistors, and other active elements are formed. Each of the Through Silicon VIA electrodes 20 is formed in areas that correspond to the non-active area in which active elements are not formed.

Figure 4A:
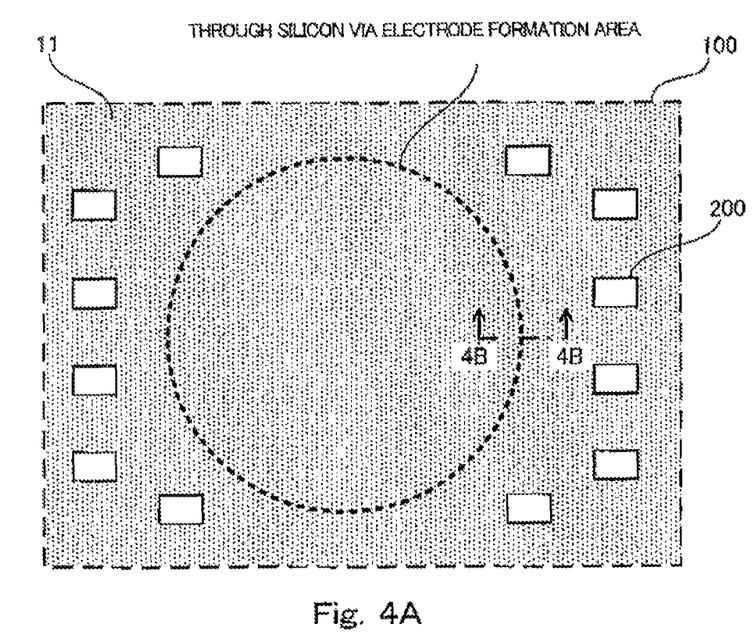
FIG. 4A is a plan view showing the configuration of the dummy pattern in the Through Silicon VIA electrode formation area according to an embodiment of the present invention.

FIG. 4A is a plan view showing the surface structure of the semiconductor substrate 10 in the formation area of the Through Silicon VIA electrode 20. The formation area of the Through Silicon VIA electrode 20 is clearly shown in the drawing. The Through Silicon VIA hole 21 of the Through Silicon VIA electrode having a substantially cylindrical shape is formed in the non-active area 100 in which photodiodes and other active elements are not formed. The STI region 11 formed by embedding $SiO_2$ film in a trench formed in the surface of the semiconductor substrate 10 extends across the entire surface of the non-active area 100. Since the STI region 11 formed in the non-active area 100 has a relatively large surface area, there is a concern that dishing will occur in the CMP step that is carried out when the STI region 11 is formed. Therefore, a dummy pattern is formed in the non-active area 100 in order to prevent dishing. The dummy pattern is provided by disposing a plurality of island-shaped dummy actives 200 in the non-active area 100. The dummy actives 200 are formed by partially exposing the silicon in the $SiO_2$ film constituting the STI region. Therefore, active elements can be formed on the dummy actives, and since the dummy actives are formed exclusively for the purpose of preventing dishing and do not contribute any function to the image sensor, transistors and other active elements do not need to be formed on the dummy actives. However, in the present invention, active elements may be formed on the dummy actives. In other words, a gate electrode and drain and source regions may be formed on the dummy actives, but these will not contribute function to the image sensor and electrodes and regions having functionality as a dummy pattern are essentially included in the dummy actives. In this case, the active elements formed on the dummy actives must be isolated from the main circuit so that they do not operate.

In the present embodiment, the dummy actives 200 are not formed in the region that overlaps the Through Silicon VIA electrode 20. In other words, the dummy actives 200 are formed only in the region outside the Through Silicon VIA electrode formation area and are not formed inside the Through Silicon VIA electrode formation area.

Figure 4B:
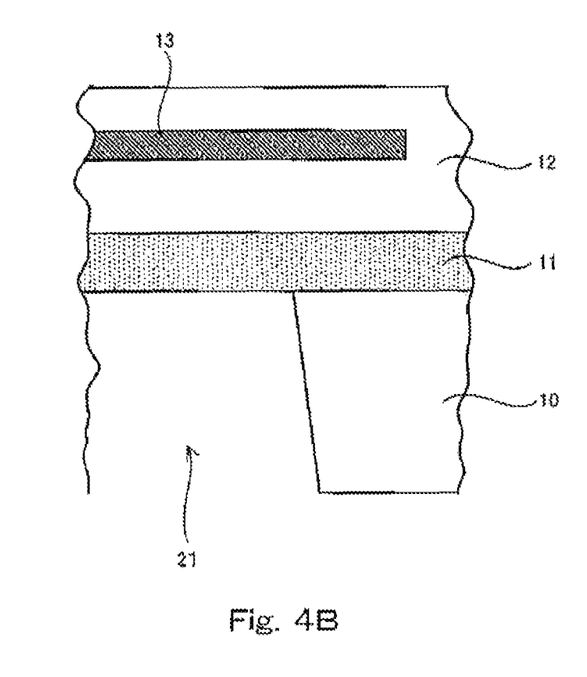
FIG. 4B is a cross-sectional view along the line 4B-4B in FIG. 4A.

FIG. 4B is a cross-sectional view along the line 4B-4B in FIG. 4A. As described above, the dummy actives 200 are not present inside the Through Silicon VIA electrode formation area, the Through Silicon VIA hole 21 is formed in the region in which only the $SiO_2$ film constituting the STI region 11 is present, and there is no portion in which the outer edge of the Through Silicon VIA electrode 20 intersects with the boundary between the STI region and the dummy actives. Therefore, the boundary between the STI region and the dummy actives where etching ions are scattered is not present in the vicinity of the sidewall of the Through Silicon VIA hole 21. The lateral scattering of the etching ions can be completely prevented in the dry etching step for forming the Through Silicon VIA hole 21. Therefore, the generation of notches in the sidewall of the Through Silicon VIA hole 21 can be effectively prevented. Since the barrier metal 22 can be formed without the occurrence of insufficient coverage on the sidewall of the Through Silicon VIA hole 21, the diffusion of Cu constituting the plating film 24 into the semiconductor substrate can be prevented.

Figure 5:
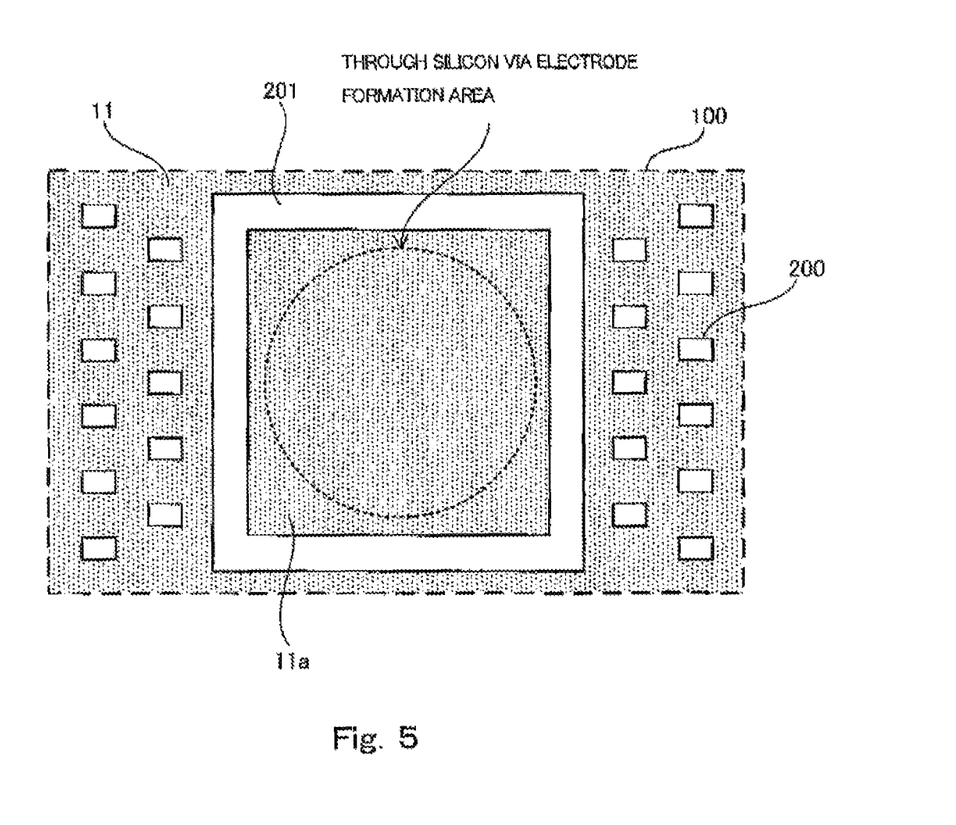
FIG. 5 is a plan view showing the configuration of the dummy pattern in the Through Silicon VIA electrode formation area according to another embodiment of the present invention.

FIG. 5 is a plan view showing the surface structure of the semiconductor substrate 10 in the Through Silicon VIA electrode formation area of the semiconductor device according to a second embodiment of the present invention. The formation area of the Through Silicon VIA electrode 20 is clearly shown in the drawing. In the present embodiment, dummy actives are not formed in the region that overlaps the Through Silicon VIA electrode formation area in the same manner as the first embodiment described above. In the present embodiment, a rectangular ring-shaped dummy active 201 that surrounds the Through Silicon VIA electrode formation area is additionally provided. In other words, a formation area for the Through Silicon VIA electrode 20 is arranged in an STI region 11a extending inside of the rectangular ring-shaped dummy active 201 wherein dummy actives are not formed. The STI region 11 in which a plurality of island-shaped dummy actives 200 are uniformly disposed extends around the periphery of the rectangular ring-shaped dummy active 201. There is no portion in which the outer edge of the Through Silicon VIA electrode 20 intersects with the boundary between the STI region and the dummy actives even in the case that the non-active area 100 in the Through Silicon VIA electrode formation area has such a structure. In the same manner as the first embodiment, the lateral scattering of etching ions can be completely prevented in the dry etching step for forming the Through Silicon VIA hole 21. Accordingly, the generation of notches in the sidewall of the Through Silicon VIA hole 21 can be effectively prevented. Since the barrier metal 22 can be formed without the occurrence of insufficient coverage on the sidewall of the Through Silicon VIA hole 21, the diffusion of Cu constituting the plating film 24 into the semiconductor substrate can be prevented. In the present embodiment, the anti-dishing effect can be improved by providing a rectangular ring-shaped dummy active 201 around the outer periphery of the Through Silicon VIA electrode formation area. In other words, since dummy actives are not disposed in the Through Silicon VIA electrode formation area, the surface area of the portion composed only of the STI region is increased, resulting in a structure that is liable to undergo dishing in the portion. However, the effect of preventing dishing is greater than that of the first embodiment because the density of the dummy actives is increased at the periphery of the Through Silicon VIA electrode formation area by surrounding the Through Silicon VIA electrode formation area with the rectangular ring-shaped dummy active 201. The external shape of the rectangular ring-shaped dummy active 201 is not limited to a rectangular shape, and, e.g., a polygonal shape other than a quadrangular shape, a circular shape, or any shape that follows the outer edge of the Through Silicon VIA hole 21 may be used.

Figure 6:
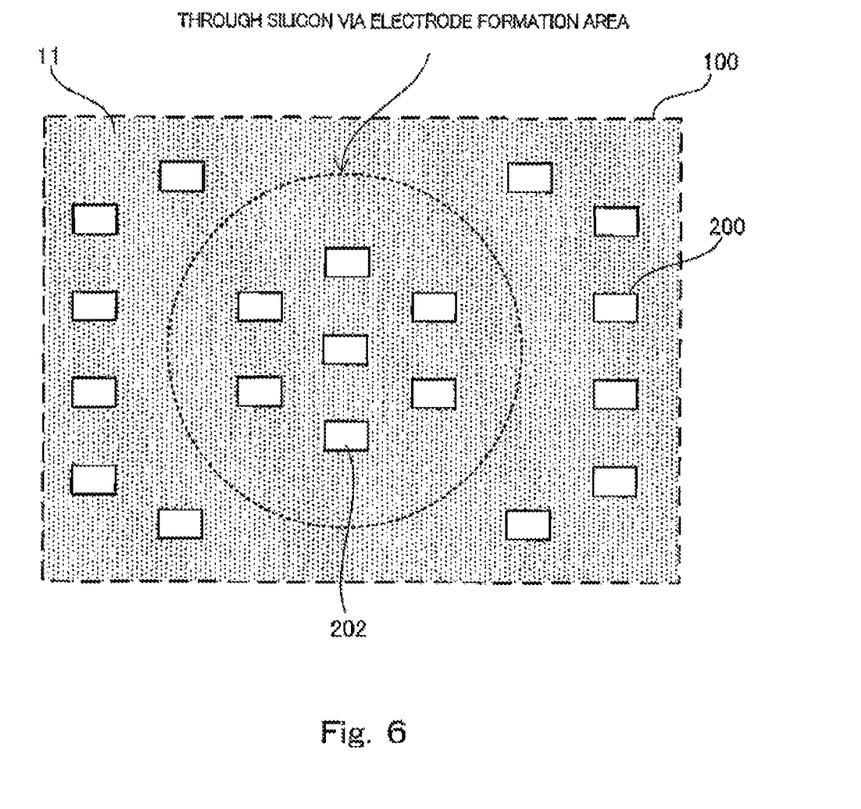
FIG. 6 is a plan view showing the configuration of the dummy pattern in the Through Silicon VIA electrode formation area according to another embodiment of the present invention.

FIG. 6 is a plan view showing the surface structure of the semiconductor substrate 10 in the Through Silicon VIA electrode formation area of the semiconductor device according to a third embodiment of the present invention. The formation area of the Through Silicon VIA electrode 20 is clearly shown in the drawing. As shown in the drawing, a plurality of island-shaped dummy actives 202 are formed in the Through Silicon VIA electrode formation area in the present embodiment, which is different from the first embodiment (FIG. 4A) described above. Dummy actives are not arranged in a position through which the outer edge of the Through Silicon VIA hole 21 passes. Dummy actives are disposed in the regions outside and in the center of the Through Silicon VIA electrode formation area. In view of the fact that notches occur only in portions in which the outer edge of the Through Silicon VIA hole 21 pass through dummy actives, as shown in FIG. 1A, it is thought that there is substantially no effect of scattered etching ions when the dummy actives are not disposed on the outer edge of the Through Silicon VIA hole 21. Therefore, dummy actives 202 can be formed inside of the Through Silicon VIA electrode formation area in a range that is not affected by laterally scattered etching ions. There are no portions in which the outer edge of the Through Silicon VIA electrode 20 intersects with the boundary between the STI region and the dummy actives even in the case that the non-active area 100 in the Through Silicon VIA electrode formation area has such a structure. On the other hand, dummy actives 202 are present in the Through Silicon VIA electrode formation area, and because of this, etching ions are scattered in the boundary between the STI region and the dummy actives 202. However, since an adequate distance to the sidewall of the Through Silicon VIA hole 21 is assured, it is expected that a possibility that the scattered etching ions etch the sidewalls of the Through Silicon VIA hole 21 and notches are generated lowers. Therefore, the diffusion of Cu constituting the plating film into the semiconductor substrate can be prevented because the barrier metal can be formed without the occurrence of insufficient coverage on the sidewall of the Through Silicon VIA hole 21. The effect of preventing dishing is greater than that of the first embodiment described above because the density of the dummy actives around the periphery of the Through Silicon VIA electrode formation area is made greater by providing dummy actives 202 inside of the Through Silicon VIA electrode formation area.

Figure 7:
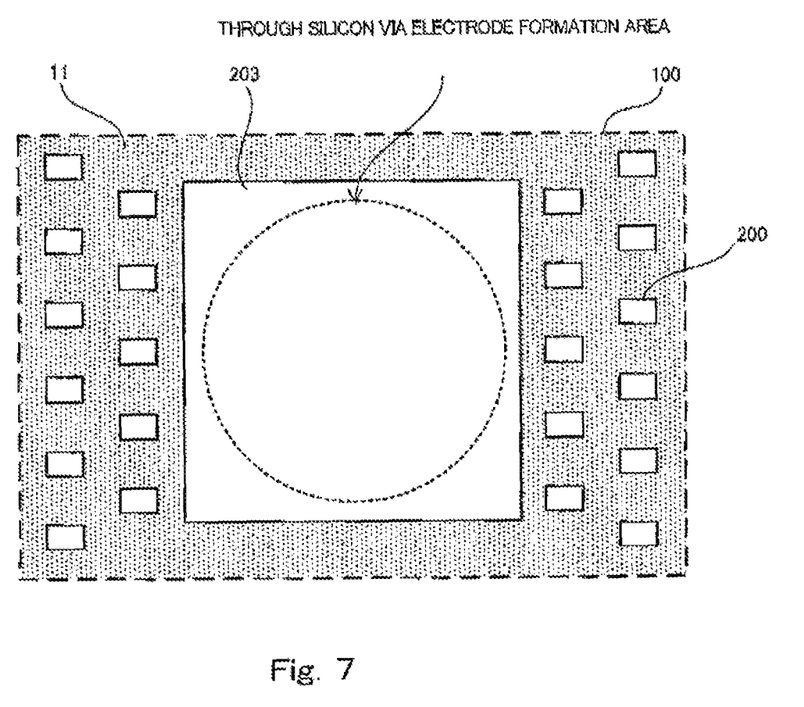
FIG. 7 is a plan view showing the configuration of the dummy pattern in the Through Silicon VIA electrode formation area according to another embodiment of the present invention.

FIG. 7 is a plan view showing the surface structure of the semiconductor substrate 10 in the Through Silicon VIA electrode formation area of the semiconductor device according to a fourth embodiment of the present invention. The formation area of the Through Silicon VIA hole 21 is clearly shown in the drawing. As shown in the drawing, a rectangular dummy active 203 having a larger surface area than the surface area of the aperture of the Through Silicon VIA hole 21 is disposed in the Through Silicon VIA electrode formation area. The STI region 11 in which a plurality of island-shaped dummy actives 200 are uniformly disposed extends around the periphery of the rectangular dummy active 203. There are no portions in which the outer edge of the Through Silicon VIA electrode 20 intersects with the boundary between the STI region and the dummy actives even in the case that the non-active area 100 in the Through Silicon VIA electrode formation area has such a structure. Therefore, the lateral scattering of etching ions can be completely prevented in the dry etching step for forming the Through Silicon VIA hole 21. Accordingly, the generation of notches in the sidewall of the Through Silicon VIA hole 21 can be effectively prevented. Since the barrier metal can be formed without the occurrence of insufficient coverage on the sidewall of the Through Silicon VIA hole 21, the diffusion of Cu constituting the plating film 24 into the semiconductor substrate can be prevented. The effect of preventing dishing is greater than that of the first embodiment described above because the density of the dummy actives around the periphery of the Through Silicon VIA electrode formation area is made greater by providing a dummy active 203 having a relatively large surface area in the Through Silicon VIA electrode formation area. In the present embodiment the external shape of the dummy active 203 is rectangular, but no limitation is imposed thereby, and other polygonal shapes, a circular shape, or any shape that follows the outer edge of the Through Silicon VIA hole 21 may be used.

Figure 8:
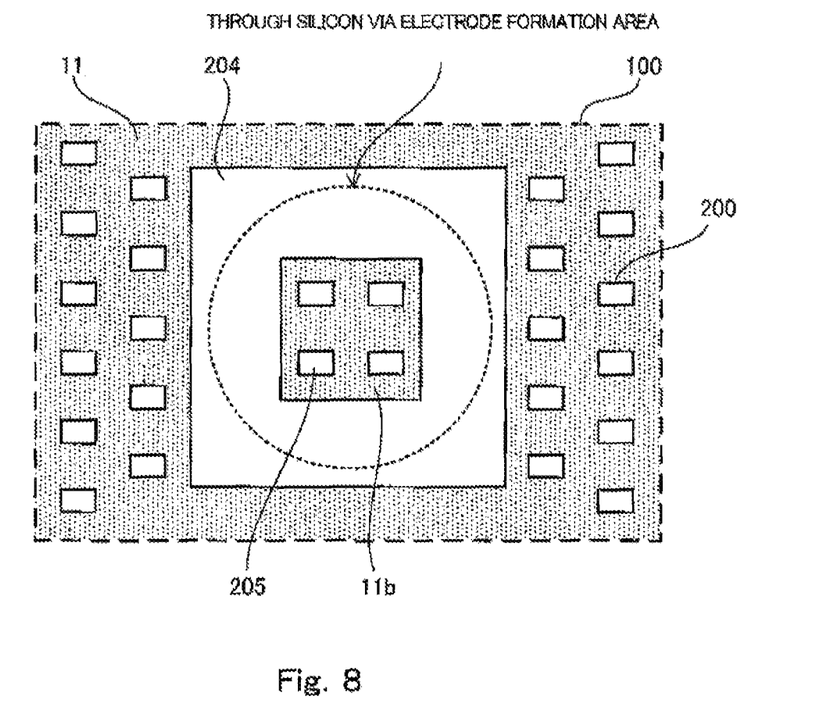
FIG. 8 is a plan view showing the configuration of the dummy pattern in the Through Silicon VIA electrode formation area according to another embodiment of the present invention.

FIG. 8 is a plan view showing the surface structure of the semiconductor substrate 10 in the Through Silicon VIA electrode formation area of the semiconductor device according to a fifth embodiment of the present invention. The formation area of the Through Silicon VIA electrode is clearly shown in the drawing. A rectangular ring-shaped dummy active 204 is formed so as to surround an STI region 11b provided inside the Through Silicon VIA electrode formation area and so as to occupy a region having a fixed range that includes the outer edge of the Through Silicon VIA electrode 20. A plurality of island-shaped dummy actives 205 is disposed in the STI region 11b. The STI region 11 in which a plurality of island-shaped dummy actives 200 is uniformly disposed extends around the periphery of the rectangular ring-shaped dummy active 204. There is no portion in which the outer edge of the Through Silicon VIA electrode 20 intersects with the boundary between the STI region and the dummy actives even in the case that the non-active area 100 in the Through Silicon VIA electrode formation area has such a structure. Provided that an adequate distance from the boundary between the dummy active 204 and the STI region 11b to the sidewall of the Through Silicon VIA hole 21 is assured, then even when etching ions are scattered in the boundary, there is little possibility that notches will be generated when the scattered etching ions etch the sidewalls of the Through Silicon VIA hole 21. Therefore, the diffusion of the plating film into the semiconductor substrate can reliably be prevented because the barrier metal can be formed without the occurrence of insufficient coverage on the sidewall of the Through Silicon VIA hole 21. The effect of preventing dishing is greater than that of the first embodiment described above because the density of the dummy actives around the periphery of the Through Silicon VIA electrode formation area is made greater by providing dummy actives 204 and 205 in the Through Silicon VIA electrode formation area.

Described next with reference to FIGS. 9A to 9D and FIGS. 10E to 10G is a method for manufacturing a package of an image sensor using a semiconductor device having the structure described in the embodiments above.

First, a wafer is prepared having a semiconductor substrate 10 on which are formed active elements 30 composed of photodiodes, cell amplifiers, and other sensor sections, color filters 15, electrode pads 13, and the like. A dummy pattern having a configuration shown in the embodiments described above is formed (FIG. 9A) in the non-active area including the Through Silicon VIA electrode formation area of the semiconductor substrate 10.

Figure 9A:
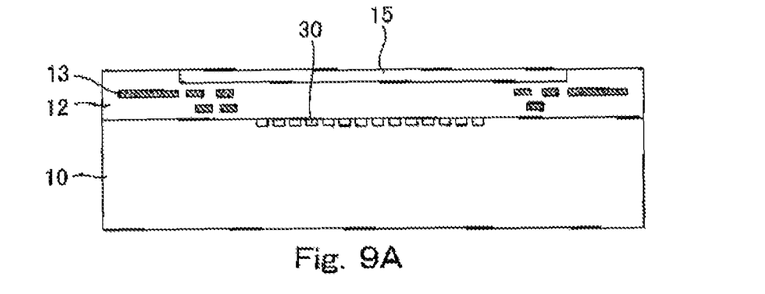
FIGS. 9A to 9D are cross-sectional views showing the steps for manufacturing an image sensor according to an embodiment of the present invention.
Figure 9B:
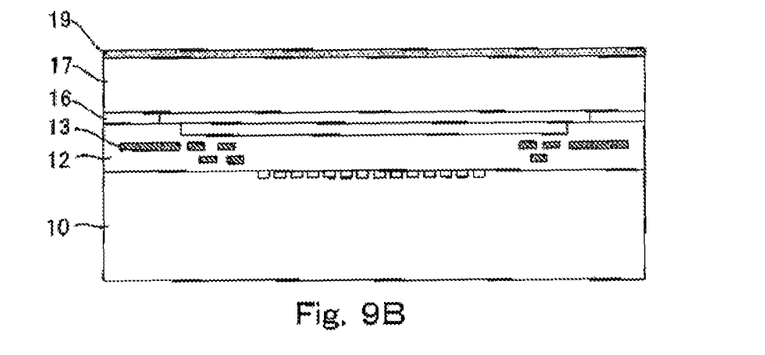

Meanwhile, a cover glass 17 is prepared in which a protective film 19 has been affixed to the surface. The protective film 19 is provided for protecting the cover glass 17 from damage during the manufacturing steps and is affixed so as to cover the entire upper surface of the cover glass 17. The cover glass 17 is then affixed to the light receiving elements formation surface of the semiconductor substrate 10 via an adhesive sheet 16 (FIG. 9B).

Figure 9C:
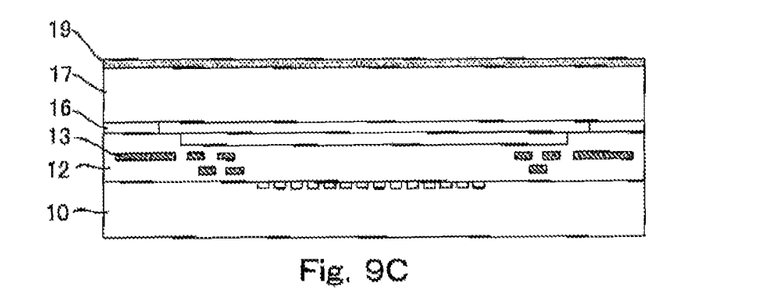

Next, the reverse surface of the semiconductor substrate 10 is polished until the thickness of the semiconductor substrate 10 reaches a predetermined value (FIG. 9C).

Figure 9D:
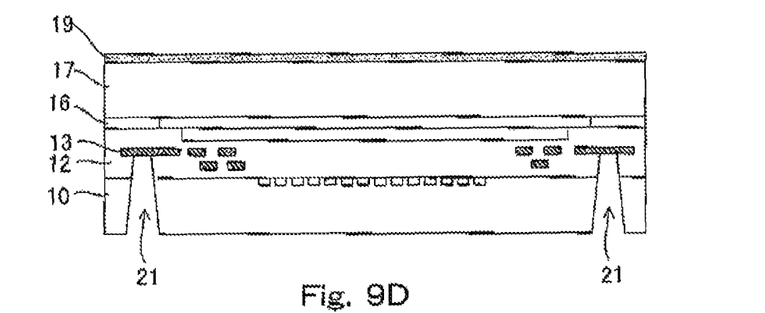

A photoresist having an aperture in the portion that corresponds to the Through Silicon VIA electrode formation area is subsequently formed on the reverse surface of the semiconductor substrate 10. The semiconductor substrate 10 exposed through the aperture of the photoresist is dry-etched from the reverse surface side to form a Through Silicon VIA hole 21 that reaches the electrode pad 13 inside the interlayer insulating film 12 (FIG. 9D). The Through Silicon VIA hole 21 is formed in the non-active area in which the dummy pattern corresponding to the embodiments described above is formed. In other words, the boundary between the dummy actives and the STI region is not present in the vicinity of the sidewall of the Through Silicon VIA hole 21 and etching ions are not scattered in the lateral direction. Therefore, notches are not generated in the sidewall of the Through Silicon VIA hole 21.

Figure 10E:
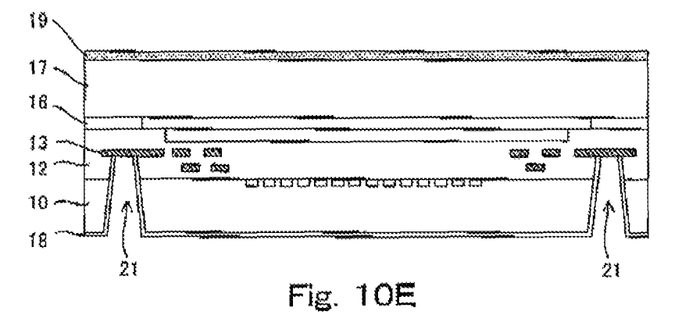
FIGS. 10E to 10G are cross-sectional views showing the steps for manufacturing an image sensor according to an embodiment of the present invention.

Next, an insulating film 18 composed of $SiO_2$ film is deposited by CVD method so as to cover the reverse surface of the semiconductor substrate 10 and the inner wall of the Through Silicon VIA hole 21. The insulating film 18 deposited on the bottom surface of the Through Silicon VIA hole 21 is etched to exposed the electrode pad 13 inside the Through Silicon VIA hole 21 (FIG. 10E).

Figure 10F:
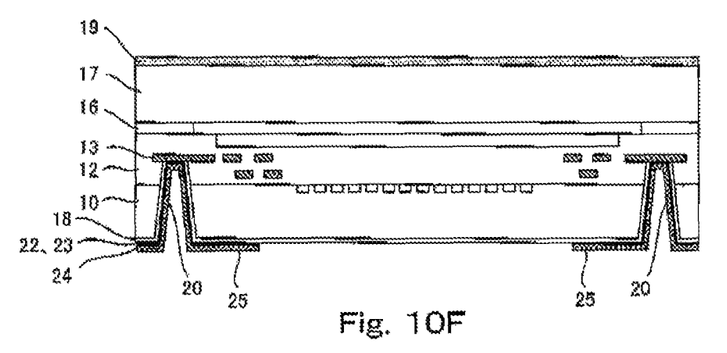

Next, a barrier metal 22 composed of Ti, Ti/Ni, or the like and a plating seed film 23 composed of Cu are sequentially formed on the sidewall and bottom surface of the Through Silicon VIA hole 21 as well as the reverse surface of the semiconductor substrate 10 by sputtering method. Because notches have not been generated in the sidewall of the Through Silicon VIA hole 21, the barrier metal can therefore be formed without the occurrence of insufficient coverage. Next, an electrode is connected to the plating seed film 23 and a plating film 24 composed of Cu is formed on the inner wall of the Through Silicon VIA hole 21 by electroplating method, thereby forming a Through Silicon VIA electrode 20. Reverse surface wiring 25 is then formed on the reverse surface of the semiconductor substrate 10. A resist is thereafter formed on the reverse surface of the semiconductor substrate 10 on which Cu film is formed using a photosensitive dry film or the like. The reverse surface wiring 25 is formed by etching Cu film through the resist. The Through Silicon VIA electrode 20 is electrically connected to the electrode pad 13 on the bottom surface of the Through Silicon VIA hole 21. The reverse surface wiring 25 is electrically connected to the electrode pad 13 via the Through Silicon VIA electrode 20 (FIG. 10F).

Figure 10G:
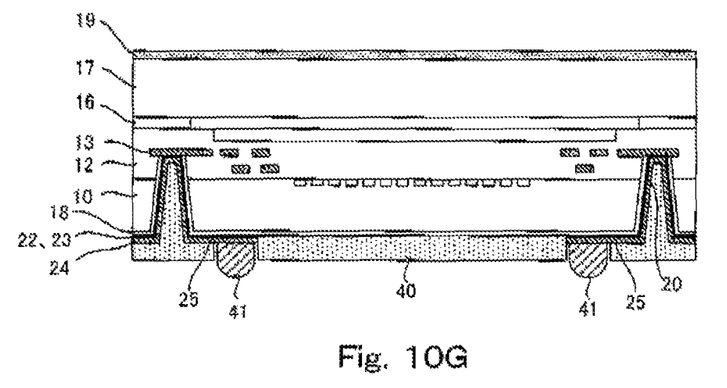

Next, a solder resist 40 as an insulating film composed of a photosetting epoxy resin is coated so as to cover the entire reverse surface of the semiconductor substrate 10 on which the reverse surface wiring 25 is formed. The solder resist 40 is dehydrated and then the exposed portions of the solder resist 40 through a photoresist are photo-cured. The interior of the Through Silicon VIA hole 21 is filled with the solder resist 40. Unexposed portions of the solder resist 40 are selectively removed to form apertures in the solder bump formation region. Next, a solder bump 41 is formed in the pad area of the reverse surface wiring 25 exposed through the aperture of the solder resist 40 by electroplating method or the like (FIG. 10G).

Next, the protective film 19 affixed to the cover glass 17 is peeled away, the cover glass is affixed to a wafer tape, and an image sensor is formed into a chip shape through the dicing process. The image sensor package is completed by carrying out the steps described above.

According to the semiconductor device and the method for manufacturing a semiconductor device of the present invention, it is obvious from the description above that dishing in the STI region can be prevented by using a dummy pattern formed in the non-active area. Dummy actives are disposed in the Through Silicon VIA electrode formation area of the non-active area such that there are no portions in which the outer edge of the Through Silicon VIA electrode intersects with the dummy actives; i.e., there are no portions in which the STI region and the dummy actives are adjacent in the vicinity of the sidewall of the Through Silicon VIA hole. Therefore, etching ions are not scattered in the vicinity of the sidewall of the Through Silicon VIA hole, and the occurrence of notches in the sidewall of the Through Silicon VIA hole can be prevented. A barrier metal can be formed on the sidewall of the Through Silicon VIA hole without the occurrence of insufficient coverage, and the diffusion of Cu and other impurities constituting the plating film into the semiconductor substrate can be reliably prevented.

The present invention has been described above with reference to the preferred embodiments. It is apparent that various modifications and changes can be envisioned by persons skilled in the art. All such modifications and changes are understood be included within the range of the appended claims.

What is claimed is:

1. A method for manufacturing a semiconductor device, comprising:
   providing a semiconductor substrate having an obverse surface and a reverse surface opposite to the obverse surface;
   forming a shallow-trench-isolation region of an insulating film on the obverse surface;
   forming, in the shallow-trench-isolation region, a plurality of island-shaped dummy portions and a second dummy portion which is surrounded with the island-shaped dummy portions and has a distance across being larger than a distance across each of the island-shaped dummy portions, wherein each of the island-shaped dummy portions and the second dummy portion has a top face coplanar with a top face of the shallow-trench-isolation region and comprises a same material as the semiconductor substrate;
   forming a plurality of active elements on the obverse surface to define an element-absence area provided adjacent to the active elements on the obverse surface, the element-absence area being free of any of the active elements;
   forming an interlayer insulating film on and over the active elements and the element-absence area;
   forming an electrode pad so as to be buried inside the interlayer insulating film and electrically connected to one or more of the active elements; and
   forming a Through Silicon VIA hole penetrating within an outer edge of the second dummy portion from the reverse surface of the semiconductor substrate to the obverse surface to form a Through Silicon VIA electrode to be electrically connected to the electrode pad;
   wherein the second dummy portion is formed to be a ring-shaped dummy portion surrounding the Through Silicon VIA hole on the obverse surface so that an inner diameter of the ring-shaped dummy portion is larger than an outer diameter of the Through Silicon VIA hole and the ring-shaped dummy portion is separated by a shallow trench isolation region from the Through Silicon VIA hole.

2. The method for manufacturing the semiconductor device of claim 1, wherein the Through Silicon VIA hole has a first aperture part on the electrode pad and a second aperture part on the reverse surface of the semiconductor substrate, the second aperture part being larger than the first aperture part.

\* \* \* \* \*